United States Patent [19]

Dummermuth et al.

[11] Patent Number: 4,831,510
[45] Date of Patent: May 16, 1989

[54] ENCODER AND RESOLVER SIGNAL PROCESSING CIRCUIT

[75] Inventors: Ernst H. Dummermuth, Chesterland; David J. Morris, Mayfield Heights, both of Ohio; Michael F. Korba, Saline, Mich.

[73] Assignee: Allen-Bradley Company, Inc., Milwaukee, Wis.

[21] Appl. No.: 97,853

[22] Filed: Sep. 17, 1987

[51] Int. Cl.$^4$ .................. G05B 23/00; G06F 3/03
[52] U.S. Cl. ................ 364/167.01; 364/560; 318/603; 341/116
[58] Field of Search .......... 364/569, 560, 559, 142, 364/474.35, 474.28, 167.01; 318/661, 603, 602; 341/116, 112

[56] References Cited

U.S. PATENT DOCUMENTS

| | | | |
|---|---|---|---|
| 3,819,268 | 6/1974 | Johnson | 356/18 |
| 3,990,062 | 11/1976 | Miller et al. | 340/347 SY |
| 4,011,440 | 3/1977 | Steglich | 235/183 |
| 4,204,257 | 5/1980 | Hungerford | 364/474 |
| 4,340,881 | 7/1982 | Stack et al. | 340/347 R |
| 4,342,077 | 7/1982 | Passey et al. | 364/183 |
| 4,348,743 | 9/1982 | Dozier | 364/900 |
| 4,379,221 | 4/1983 | Avins et al. | 377/43 |
| 4,429,267 | 1/1984 | Veale | 318/594 |
| 4,449,117 | 5/1984 | Fortescue | 340/347 SY |
| 4,472,669 | 9/1984 | Denham et al. | 318/661 |
| 4,481,468 | 11/1984 | Ono et al. | 324/163 |
| 4,486,845 | 12/1984 | Duckworth | 364/559 |
| 4,529,922 | 7/1985 | Ono | 318/603 |
| 4,538,235 | 8/1985 | Henning | 364/569 |
| 4,573,139 | 2/1986 | Bonwich | 364/900 |
| 4,597,081 | 6/1986 | Tassone | 371/25 |
| 4,612,503 | 9/1986 | Shimizu et al. | 324/208 |
| 4,631,523 | 12/1986 | Ono et al. | 341/116 |
| 4,639,884 | 1/1987 | Sagues | 364/565 |
| 4,714,913 | 12/1987 | Cohen | 340/347 P |
| 4,728,834 | 3/1988 | Kumar et al. | 310/68 R |

Primary Examiner—Parshotham S. Lall
Assistant Examiner—S. A. Melnick
Attorney, Agent, or Firm—Quarles & Brady

[57] ABSTRACT

A circuit can be configured to process signals from either a resolver or an encoder to derive an indication of the sensed angular position. (1) When the circuit is configured for an encoder, the output from the encoder is periodically sampled. The phase relationship of the encoder input signals controls a counter. The output of the counter is periodically sampled to provide the position indication. (2) In the resolver configuration, the counter is rest at regular intervals. An apparatus detects zero crossings from the resolver signal and in response thereto samples the counter output to provide a measurement of the time interval between the counter reset and the zero crossing. The magnitude of the time interval corresponds to the phase angle of the resolver signal and hence to the angular position.

15 Claims, 6 Drawing Sheets

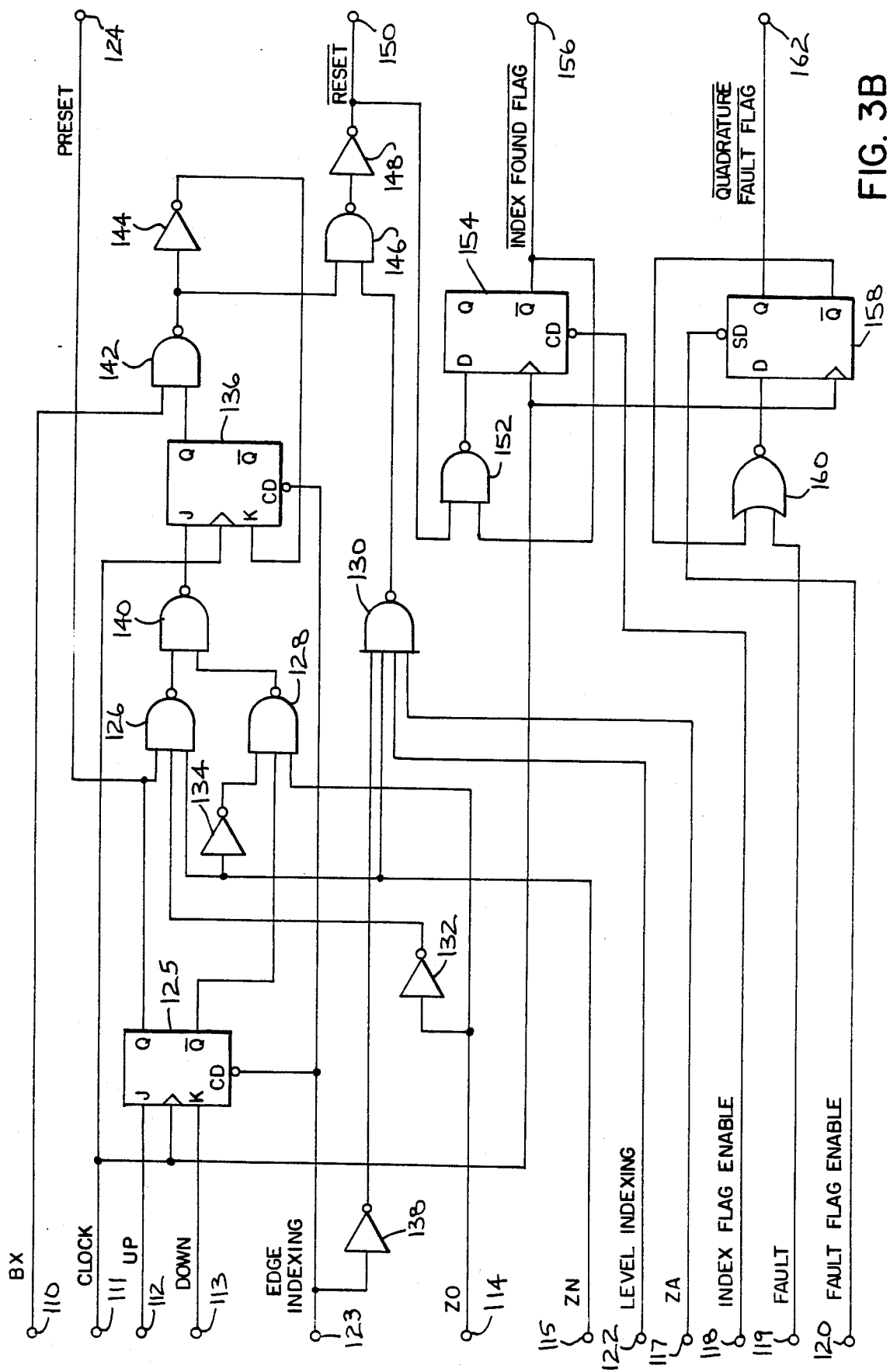

4,831,510

ENCODER AND RESOLVER SIGNAL PROCESSING CIRCUIT

The present invention relates to circuits for processing the signals from resolvers or encoders to derive the angular position of the shaft connected to the encoder or the resolver.

BACKGROUND OF THE INVENTION

Resolvers and encoders are two types of transducers that are used to determine the angular position of a rotating shaft. For example, these devices are often incorporated in a machine tool to determine the angular position of a rotating shaft. Each type of transducer produces an electrical output which must be decoded to determine the angular position and direction of rotation.

The resolver has a coil wound on a rotor and two coils wound on its stator at 90° with respect to each other. The shaft of the resolver rotor is coupled to the rotating mechanism whose position is to be determined. A signal generator produces two sinusoidal electrical signals which differ in phase by 90°. These signals are commonly referred to as sine and cosine signals. The sine and cosine signals are applied to the stator coils so as to induce a signal in the rotor coil. As the rotor coil rotates, the phase angle of the signal induced in the rotor coil shifts in relationship to the angular position of the rotor. Typically, the angular position is determined by comparing the rotor signal to one of the excitation signals either the sine or cosine signal, to detect the phase difference. The magnitude of the phase difference corresponds to the angular position of the rotor shaft. By comparing the derived angular positions at two points in time the direction and velocity of rotation can be determined.

Encoders are another type of angular position transducer which operate entirely differently from resolvers. An incremental encoder produces two pulsed output signals which are in quadrature. The direction of the encoder's rotation may be determined by detecting which of the two output signals leads the other one. Each output signal contains an integral number of pulses per revolution. The angular position is determined by counting the number of pulse transitions in both of the signals. A third output signal from the encoder provides an index pulse once per revolution which is used to reset the position counter to the zero degree position, for example.

Not only do resolvers and encoders operate differently, but different manufacturers produce encoders that perform differently. For example, the polarity of the encoder output signals vary from manufacturer to manufacturer. Specifically, one company's encoder may produce a high logic level index pulse whereas another encoder may produce a low level index pulse. In addition, the length of the index pulse may vary from one device to another. All of these variations among different types of transducers have heretofore required separate electrical circuits specifically designed to process the output signals from each type of resolver or encoder.

If one of these transducers is incorporated in a machine tool for example, a resolver cannot be used in place of an encoder or vice versa. Furthermore, different types of encoders cannot be substituted for each other without redesigning the electronic signal processing circuitry. Without going through such an expensive and time consuming redesign process, a machine tool manufacturer may be limited to purchasing the transducer from only one source during the lifetime of the machine design. The ultimate user of the machine is at a further disadvantage since if a transducer fails, he does not have the ability to redesign the processing circuitry. The user must replace the failed transducer with one that exhibits identical characteristics as the original transducer, regardless of the cost or availability.

SUMMARY OF THE INVENTION

The present invention provides an electronic circuit which may be configured by the user to not only process signals from either a resolver or an encoder but also to process output signals from different types of encoders. The processing circuitry includes a number of components that are common to either the resolver or encoder mode of operation and whose precise operation may be changed by the configuration parameters that are set to correspond to the exact type of transducer that is used with the circuit.

In the encoder mode the system enables a quadrature detector to process the signals from the transducer. The quadrature relationship of the two signals is used to set a counter to either increment or decrement the count of pulses from a clock. One of the configuration parameters of the circuit designates the method by which the index signal is used to reset the counter to an initial value. This designation depends upon the type of index signal that is produced by the transducer.

In the resolver mode, the present circuit is configured to count the number of clock pulses between a reference pulse and a zero crossing of the output signal from the resolver. Periodically, the count is read and processed to derive the angular position. The magnitude of the count also indicates how far back in time the zero crossing occurred and is used to determine the exact position of the shaft at the time the count was sampled. This provides a very current determination of the angular position being sensed.

An object of the present invention is to provide a digital circuit for processing the signals from either a resolver or an encoder.

A further object of the present invention is to provide an electronic circuit that is capable of being configured to process not only signals from either an encoder or a resolver but also signals from several types of resolvers and encoders.

Yet another object is to utilize the zero crossings of the output signal from a resolver to determine the phase shift of the output signal in relation to the signal applied to the resolver. A further enhancement of this object is to determine the staleness of such zero crossing information so that the angular position may be extrapolated to derive the current position of the object being sensed.

A further object of the present invention is to provide a circuit that when operated in the encoder mode may be configured to provide either signal level sensitive or pulse edge sensitive indexing depending upon the nature of the index pulse received from the particular type of encoder being used. In addition, this object is enhanced by providing a mechanism which compensates for variation in the indexing depending upon the direction of rotation of the transducer.

DETAILED DESCRIPTION OF THE PRESENT INVENTION

Figure 1:
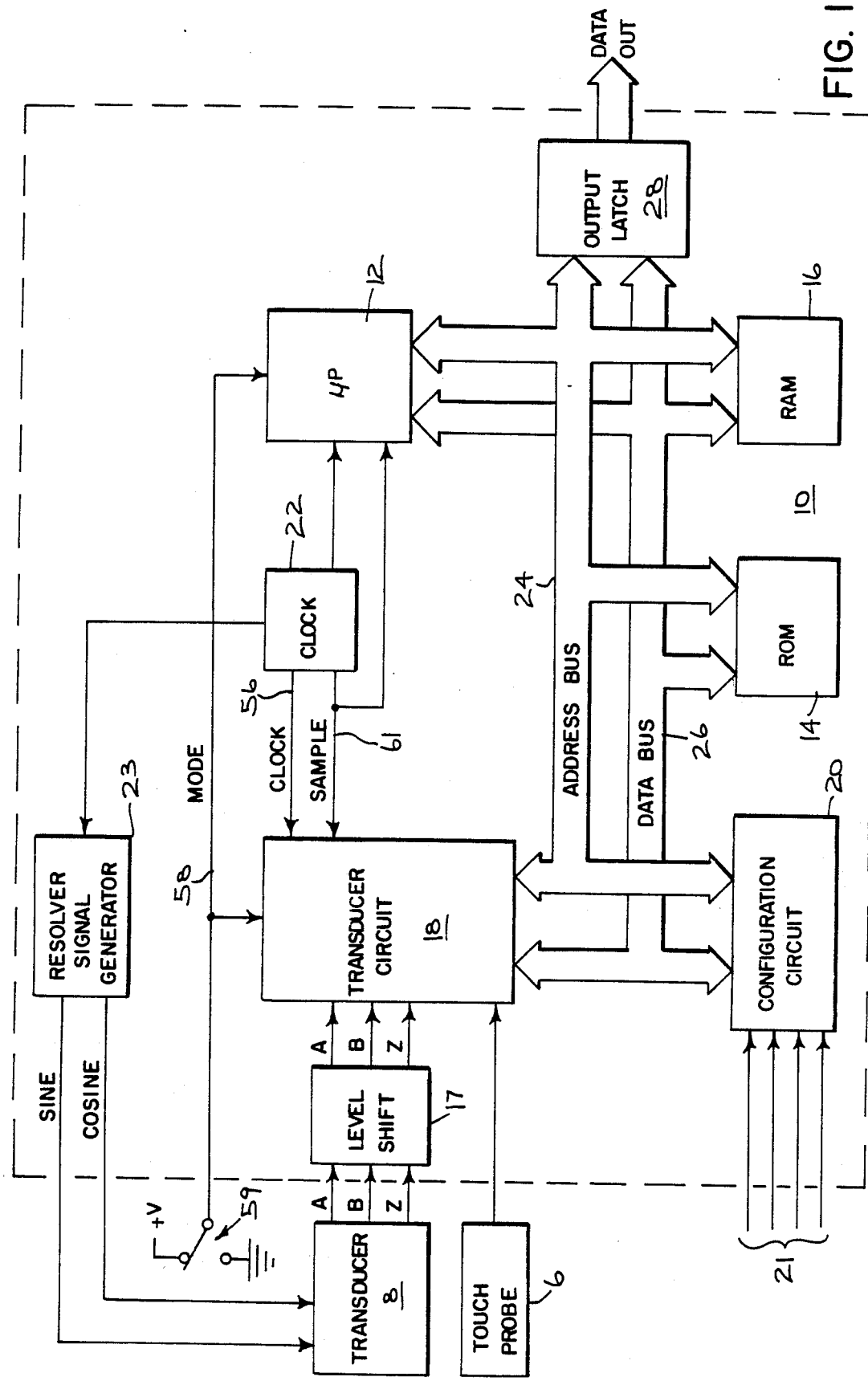
FIG. 1 is a block diagram of an angular position processing system according to the present invention.

As shown in FIG. 1, a transducer signal processing circuit 10 receives the signals on input lines designated A, B and Z from an angular position transducer 8, which may be either a resolver or an encoder The signals on the input lines from the transducer 8 are converted to TTL level signals by a level shifter 17. The outputs of the level shifter are coupled to a transducer circuit 18. The transducer circuit 18 processes the analog transducer signals to provide digital information which a microprocessor 12 then analyzes to determine the angular position sensed by the transducer. The microprocesser 12 executes a program stored in a read-only memory 14. A random access memory 16 is provided for storage of data received and generated by the processing circuit.

The transducer circuit 18 also includes an input from a conventional touch probe type digital gauging device 6. Touch probes are often used on numerically controlled machine tools to produce a signal when the movable part of the machine tool encounters an object. For example, the touch probe may be used to sense the walls defining an aperture in the workpiece, thereby enabling the machine tool to precisely measure the dimensions of the aperture along different axes.

A configuration circuit 20 stores the signal levels on input lines 21 which define parameters for configuring the transducer circuit 18 to accept input signals from one of a variety of types of transducers 8. These input lines are coupled to a series of configuration switches (not shown). During the initialization of the processing circuit 10 the microprocessor 12 addresses the configuration circuit 20 to read the various parameters and configures the transducer circuit 18, as will be explained in detail subsequently. Alternatively, the configuration parameters for the transducer circuit 18 may be stored in ROM 14. This alternative has a disadvantage in that the parameters may not be easily changed should a different type of transducer be used with the system.

As is shown in FIG. 1, microprocessor 12, ROM 14, RAM 16, transducer circuit 18, and configuration circuit 20 are interconnected by common address and data buses 24 and 26 respectively. Additional lines (not shown) extend between the microprocessor 12 and the ROM 14 and RAM 16 to control the reading and writing of data. The two buses 24 and 26 are also connected to an output latch 28 which interfaces the transducer signal processing circuit 10 to an external device which ultimately uses the sensed angular position information. Although not shown on FIG. 1, additional lines run between the microprocessor 12 and the other components to control the transfer of data into and out of the components.

The processing circuit 10 also includes a clock 22 for generating the timing signals for microprocessor 12 and the transducer circuit 18. Specifically, the clock 22 provides a CLOCK signal and a SAMPLE signal to the transducer circuit on lines 56 and 61 respectively. The clock also produces a timing reference signal for the resolver signal generator 23. The signal generator 23 derives conventional sine and cosine signals from the reference signal which are required when a resolver is used as transducer 8.

Figure 2:
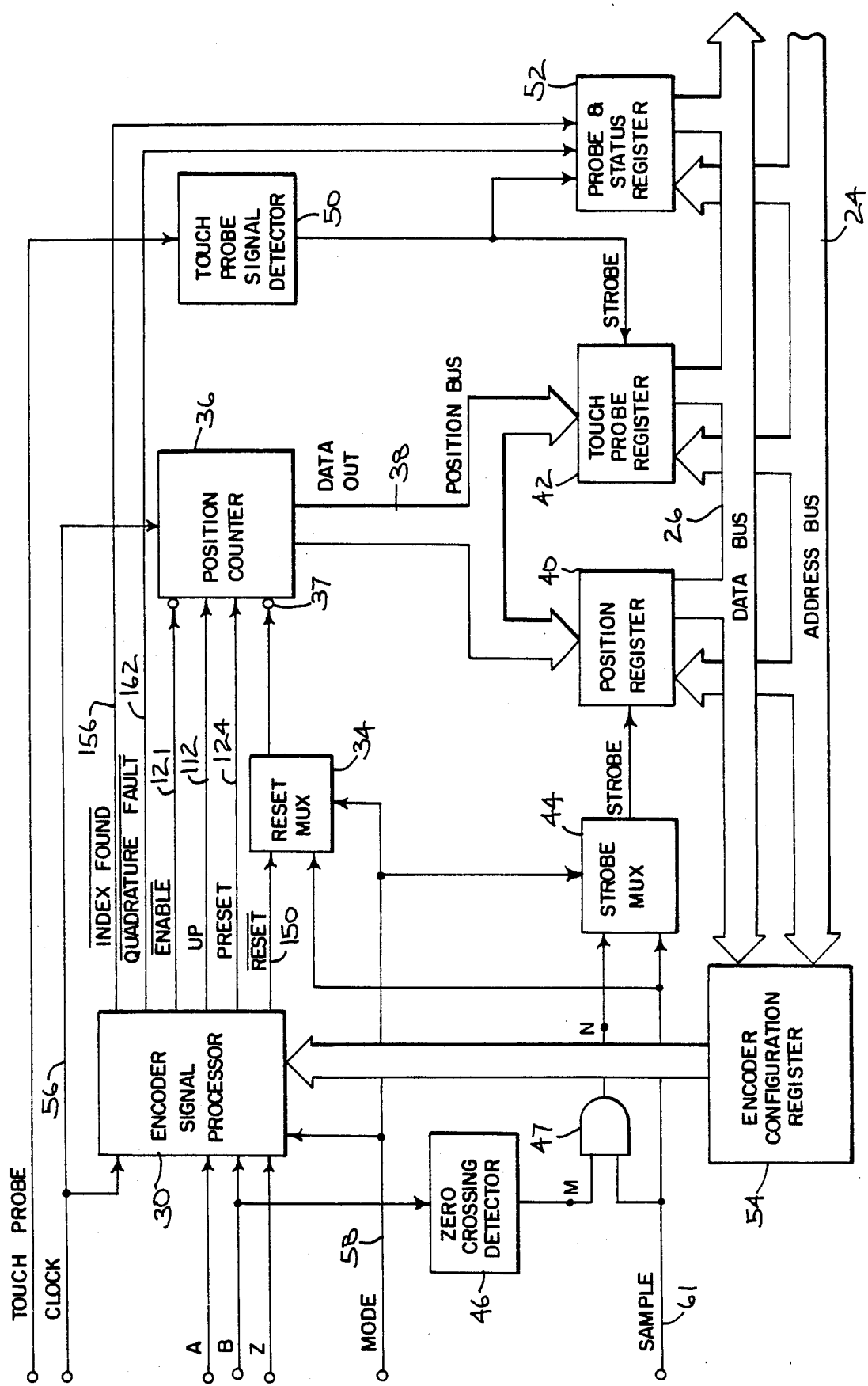
FIG. 2 is a block schematic diagram of the transducer circuit shown in FIG. 1.

FIG. 2 shows the details of the transducer circuit 18. The three transducer signal input lines A, B and Z are connected to an encoder signal processor 30 which provides quadrature detection, index detection and signal fault detection. The encoder signal processor will be described in the following section dealing with encoder mode operation. The encoder signal processor 30 produces a set of control signals for a sixteen bit presettable up/down position counter 36. The control signals from the encoder signal processor 30 include count enable, count direction and preset count. A 2 to 1 reset multiplexer 34 couples either the reset signal from the encoder signal processor 30 or the SAMPLE signal on line 61 to the reset terminal 37 of the position counter 36 in response to the MODE signal. The preset count signal determines which of two predetermined values the counter will assume upon receiving a reset signal. Both the encoder signal processor 30 and the position counter 36 receive the CLOCK signal on line 56 from clock 22.

The count data from the position counter 36 is continuously outputted in parallel on a position bus 38 to the data inputs of a position register 40 and a touch probe register 42. Each of these registers has a single sixteen bit storage location for storing the digital count from the position counter 36. When the position and touch probe registers 40 and 42 receive an enabling signal on their respective strobe terminal, the number present on the position bus 38 is stored in the respective register.

The B input line of the transducer circuit 18 is also connected to a zero crossing detector 46 which produces a positive output pulse whenever the signal on the B input line makes a high to low zero crossing. This output pulse is coupled to one input of AND gate 47. The other input of the AND gate 47 receives the SAMPLE signal from clock 22 via line 61. The output of the AND gate 47 is connected to an input of 2 to 1 strobe signal multiplexer 44. The other input of the strobe signal multiplexer 44 receives the SAMPLE signal from clock 22. The output of strobe multiplexer 44 is coupled to the strobe terminal of the position register 40 to periodically enable the register to store the data on the position bus.

The touch probe input to the transducer circuit 18 is connected to a signal detector 50 which has an output terminal connected to the strobe terminal of the touch probe register 42. The touch probe signal detector 50 senses the activation of the touch probe 6 to produce the strobe signal pulse at its output terminal. The output terminal of the touch probe signal detector 50 is also connected to a transducer circuit status register 52. The status register 52 stores the strobe signal from the touch probe signal detector 50 to indicate the occurrence of a touch probe triggering. Other inputs to the status register 52 indicate different states of the encoder signal processor 30 as will be described. The contents of the status register 52 are periodically read by microprocessor 12 in order to sense the occurrence of various events, such as touch probe activation.

The encoder signal processor 30 receives configuration signals from an encoder configuration register 54. These signals configure the encoder signal processor 30 for the specific type of encoder that is connected to it.

The tranducer circuit registers 40, 42, 52 and 54 are connected to both the address bus 24 and the data bus 26 of the transducer signal processing circuit 10. This interconnection enables the microprocessor 12 to read information from the position register 40, the touch probe register 42 and the status register 52, as well as to load configuration data in the encoder configuration register 54 during the system initialization.

Resolver Mode Operation

As noted above, the present transducer processing circuit 10 can be configured for use with a resolver as the transducer 8. With reference to FIGS. 1 and 2, a high logic level MODE selection signal is applied to line 58 by a manual switch 59 to place the processing circuit 10 in the resolver mode. In this mode, the outputs of the encoder signal processor are forced so that the position counter 36 is configured to continuously count pulses of the CLOCK signal on line 56 and to reset to a zero count when a low level is applied to terminal 37. The high logic level on MODE line 58 also causes the reset multiplexer 34 to connect the SAMPLE signal from clock 22 to the reset terminal 37 of the position counter 36. The strobe multiplexer 44 also receives the high level MODE selection signal which causes the multiplexer 44 to connect the output from the AND gate 47 to the strobe terminal of the position register 40. This latter connection causes the position register 40 to store the data present on the position bus 38 whenever a zero crossing occurs in the signal on the B transducer input line which receives the output signal from the resolver.

Figure 6:
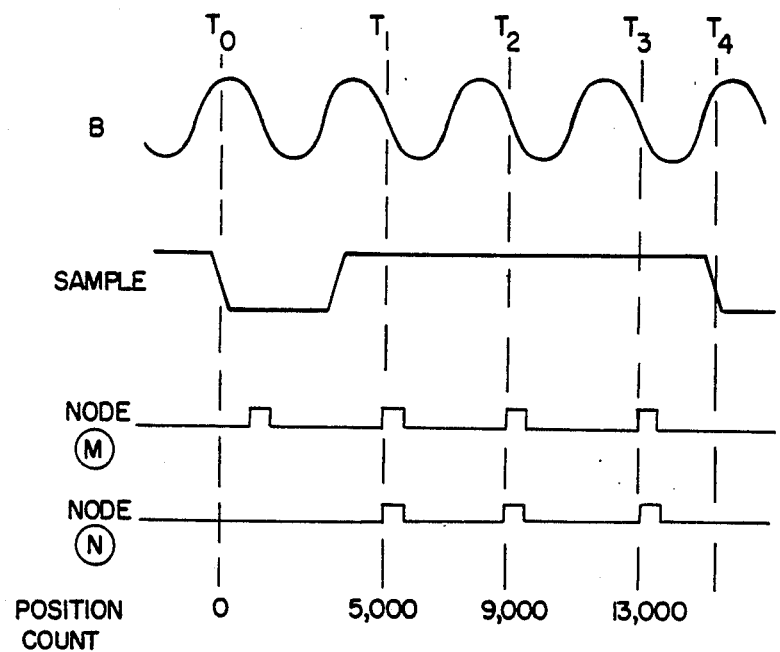
FIG. 6 is a waveform diagram of signals at several points in the transducer circuit during the processing of the output from a resolver.

The operation of the transducer circuit 18 in the resolver mode is best described with reference to the waveform diagram illustrated in FIG. 6. The top waveform of FIG. 6 shows the sinusoidal signal from the rotor coil of the resolver that is coupled to the B input line. This output signal is induced in the resolver's rotor coil from the sine and cosine excitation signals produced by the signal generator 23. The frequency of the sine and cosine signals and hence the output signal from the resolver is 5 KHz, although resolver frequencies may range from 1 to 10 KHz. The frequency of the CLOCK signal to the transducer circuit 18 on line 56 is an integer multiple of the output signal frequency from the resolver. For example, the CLOCK signal is 20 MHz so that it makes 4,000 cycles during each cycle of the 5 KHz resolver excitation signal.

The clock circuit 22 also generates the SAMPLE signal having a frequency one-fourth that of the resolver excitation signals, or 1.25 KHz. Since both the SAMPLE and the resolver excitation signals are derived from the same clock circuit 22, they are in synchronism. In the waveform example depicted in FIG. 6, the SAMPLE signal has a low level pulse that begins a time T0 and lasts for one cycle of the resolver excitation signal. At that point the SAMPLE signal goes high for three cycles of the excitation signal. The falling edge of the SAMPLE signal at time T0 resets the count in the position counter 36 to zero and a new count of the CLOCK signal pulses on line 56 begins. The frequencies of the excitation, CLOCK and SAMPLE signals are sufficiently high with respect to the speed at which the position of the resolver changes so that the desired accuracy of position sensing is achieved.

Referring to the details of the transducer circuit in FIG. 2, the zero crossing detector 46 produces a high level output signal at node M on each high to low crossing of the zero axis by the resolver output signal on line B as depicted in FIG. 6. The first such crossing occurring shortly after time T0 is inhibited from passing through the AND gate 47 by the low level SAMPLE signal which is applied to the other input of the gate 47. This is shown in the waveform for node N in FIG. 6. When the SAMPLE signal goes high, the AND gate 47 is placed in a state in which its output level corresponds to the level of the signal from the zero crossing detector 46. Therefore, a time T1 when the next high to low zero crossing occurs in the resolver signal, a high logic pulse is sent from the zero crossing detector 46 through AND gate 47 and multiplexer 44 to the strobe input of the position register 40.

This strobing pulse causes the position register 40 to store the count from the position counter 36 at that point in time. For example, for the frequencies previously specified the count at time T1 is 5,000. At time T2 another high to low zero crossing occurs in the resolver signal which causes the position register 40 to be updated with the current position count. For example, the count at T2 is 9,000. Similarly, at time T3 another zero crossing occurs in the resolver signal which updates the position register 40 to the current count of the CLOCK signal pulses. At this point in time the current count from the position counter 36 is 13,000, for example.

At time T4, the SAMPLE signal has another falling edge which in addition to resetting the position counter 36 also signals the microprocessor 12 (FIG. 1) that the transducer circuit 18 has a valid output for processing to derive the angular position of the resolver. The microprocessor 12 responds to the falling edge of the SAMPLE signal by addressing the position register 40 via address bus 24 and reading the contents of the register via the data bus 26. The microprocessor 12 reads the position register contents during the period when the SAMPLE signal is at a low state and the position register contents are not subject to change.

If the resolver's rotor remains stationary, the position register 40 will contain the same value over several sampling periods. However, when the phase of the resolver output signal varies as occurs with changes in the position of the resolver rotor, the final count in the position register 40 at time T4 will also vary. For example, the count at time T3 in the above example was 13,000 but if the zero crossing occurred slightly before time T3 the counter count would be less, for example, 12,000. Therefore as the resolver rotates the sample counts taken by the position register will vary in magnitude corresponding to the position of the rotor. With respect to the frequencies used in the above example, each 0.09 degree change in the position of the resolver's rotor will change the stored count in the position register 40 by one (360°/4000 counts per revolution).

The microprocessor 12 performs modulo 4,000 arithmetic on the contents of the position register 40 to determine the position of the resolver's rotor. The equation solved by the microprocessor 12 is:

$$NP = PC \text{ MOD } 4000 \qquad (1)$$

Performing the arithmetic operation for the above example where the final position count (PC) in the position register 40 at time T4 equals 13,000, yields a normalized position (NP) of 1,000. This value may be used directly as an indication of the relative position of the resolver rotor or it may be multiplied by 0.09 degrees to determine the position in degrees (e.g. 90 degrees).

As can be seen by the waveform diagram of FIG. 6, when the sample count is read at point T4, the count represents the position of the resolver at time T3 which occurred some time prior to time T4. Therefore, the position data being processed by the microprocessor 12 is stale as it does not reflect the angular position at sampling time T4. The degree of staleness varies with the rotor's position. In addition if for some reason the count was not sampled at time T3, the position count at time T2 would be stored in the position register 40. Although the count at T2 produces a valid position indication using equation (1), the result is very stale. However, because the data is processed at a fixed point in time with respect to the resetting of the position counter 36 at time T0, the magnitude of the position register contents is a direct indication of the degree of staleness of the position count sample. Specifically, the larger the number in the position register 40, the more current is the sample. For example, if the sample that is being processed by the microprocessor was taken at time T2, the contents of the position register will be 9,000 whereas if the sample is taken more recently at time T3, the position register contents will be 13,000.

The position register contents is used to calculate how long ago in time the sample was taken. The staleness, or the time interval between the last time a count was stored in position register 40 and time T4, is computed using the equation:

$$\text{Staleness} = SP - |PC \times CP| \quad (2)$$

Where SP represents the sample signal period, PC represents the position count and CP represents the clock signal period. Using the signal frequencies of the present embodiment, the staleness of the sample taken at time T3 in the above example is given by:

$$\begin{aligned}\text{Staleness} &= 800 \ usec - |13,000 \times 50 \ nsec| \\ &= 150 \ usec\end{aligned}$$

Once the staleness time has been determined, it can be used to compute the actual position of the resolver at time T4 when the count stored in the position register 40 was read. As noted previously, the various signal frequencies have been chosen so that position samples will be taken at a relatively high rate as compared to the rate of change of the angular position of the object being measured. Therefore, the rate of change in velocity of the rotating object will remain relatively constant from one computation by microprocessor 12 to the next. The microprocessor 12 stores the previously computed angular position in RAM 16. The previous position is compared to the currently computed position to derive the velocity, i.e. the rate of change of the resolver position between the two consecutive samples. Since the samples are taken at substantially fixed intervals of time, the velocity computation is straightforward. This velocity is then multiplied by the staleness time to determine the incremental distance that the resolver has rotated between the last zero crossing (T3) and the time (T4) at which the samples were read from the position register 40. This incremental distance is added to the position at time T3, computed from equation (1) above, to determine the actual position of the resolver at time T4 when the sample was read by microprocessor 12. Although the point in time when the resolver signal makes a zero crossing varies according to the position of the resolver, this method may be used to project the actual position of the resolver at fixed point in time, such as the sampling point T4.

The transducer circuit 10 in the resolver mode provides not only a mechanism for determining digitally the position of the resolver but a technique for determining the staleness of that sample. This enables the circuit to extrapolate the measured position to derive the position of the resolver at a known point in time.

Encoder Mode Operation

As previously noted, the present transducer processing circuit 10 can be configured to analyze the signals from an incremental encoder, as well as a resolver. With reference to FIGS. 1 and 2, when the circuit 10 is to be used with an encoder, various signal parameters must be stored in the configuration register 54 of the transducer circuit 18. The parameters are inputted into the configuration register 54 from the configuration circuit 20. These parameters define the polarity of the input signals and the type of index pulse from the encoder. In addition, the parameters enable or disable other features of the processing circuit 10 such as fault detection. These configuration parameters will be described in the course of the following explanation of the operation of the processing circuit 10 in the encoder mode.

Figure 4:
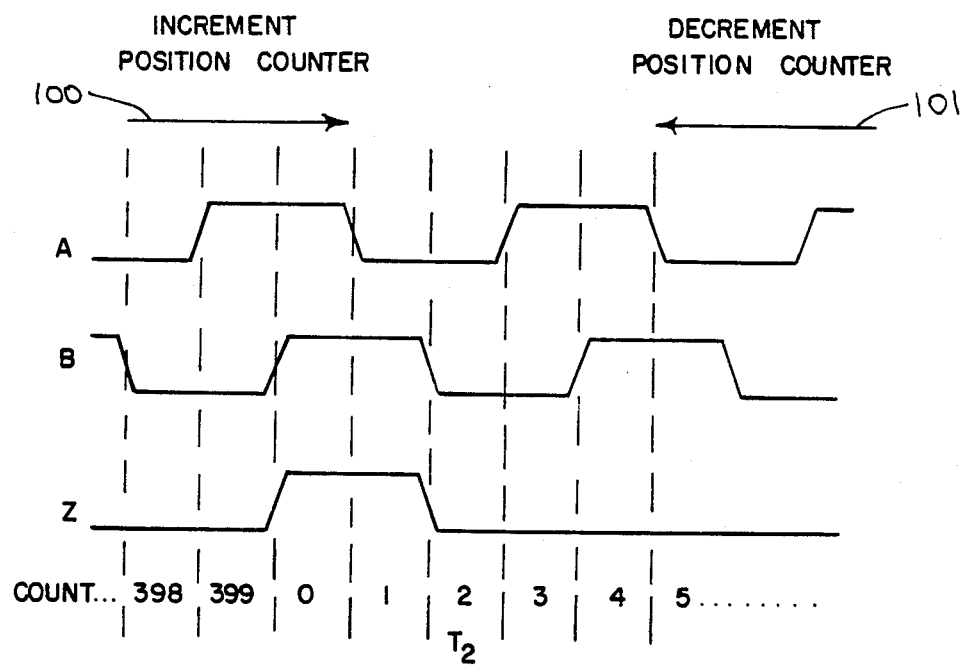
FIGS. 4 and 5 are waveform diagrams of the signals from two different types of encoders which may be used with the present invention.

A conventional position encoder produces two signals, referred to herein as the A and B signals, which are in quadrature phase relationship. For each predetermined amount of rotation of the encoder shaft a pulse will be produced in these signals. For example, each revolution of the encoder shaft produces 100 pulses in the output signal. FIG. 4 shows the phase relationship between the A and B output signals from an encoder. Each signal period can be divided into four intervals in which the levels of the A and B signals are at four different states. The vertical dashed lines in FIG. 4 separate these intervals. By counting the transitions between the signal states, the angular position of the encoder shaft is determined.

Once per revolution the encoder produces a pulse on line Z which is used to index the position of the encoder. Typically, the encoder is positioned relative to the position of the shaft so that the index pulse occurs at the zero degree position of the shaft. The index pulse initializes the circuit that counts the encoder pulses.

Figure 5:
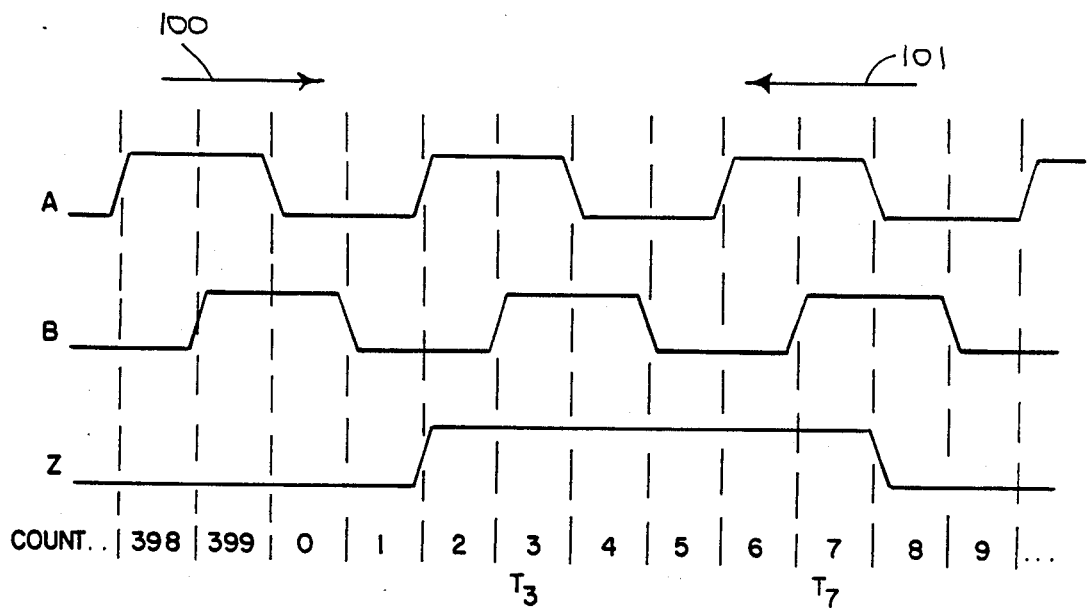

Encoder manufacturers have adopted different index signal formats for their devices. For example, the encoder waveform of FIG. 4 produces an index pulse having the same duration as the pulse on the B output line. However, the encoder waveform illustrated in FIG. 5 has an index pulse with a duration equal to one and a half cycles of the B channel signal. Whereas the processing of the index signal of the device in FIG. 4 is fairly straightforward in that indexing can occur when all three signals, A, B and Z, are at a high logic level, the processing of the index signal illustrated in FIG. 5 is more difficult. Depending upon the rotation direction of the FIG. 5 device, the coincidence of three high level signals will first occur when the count of position counter 36 is either three or seven. Thus accurate level sensitive indexing is unfeasible with this type of encoder. In this case a complex indexing technique based on pulse edges must be employed, as will be described later. The present processing circuit can configured to process either type of encoder signal with equal degrees of accuracy.

When the present system is used with an encoder, the transducer circuit of FIG. 2 has a low logic level applied to its MODE selection line 58 by switch 59 (FIG. 2). This logic level causes the reset multiplexer 34 to couple the reset signal line from the encoder signal processor 30 to the position counter 36 and enables the operation of the encoder signal processor 30. Similarly, the high MODE selection level places the strobe multiplexer 44 in a state in which the SAMPLE signal is connected to the enable input of the position register 40.

Figure 3A:
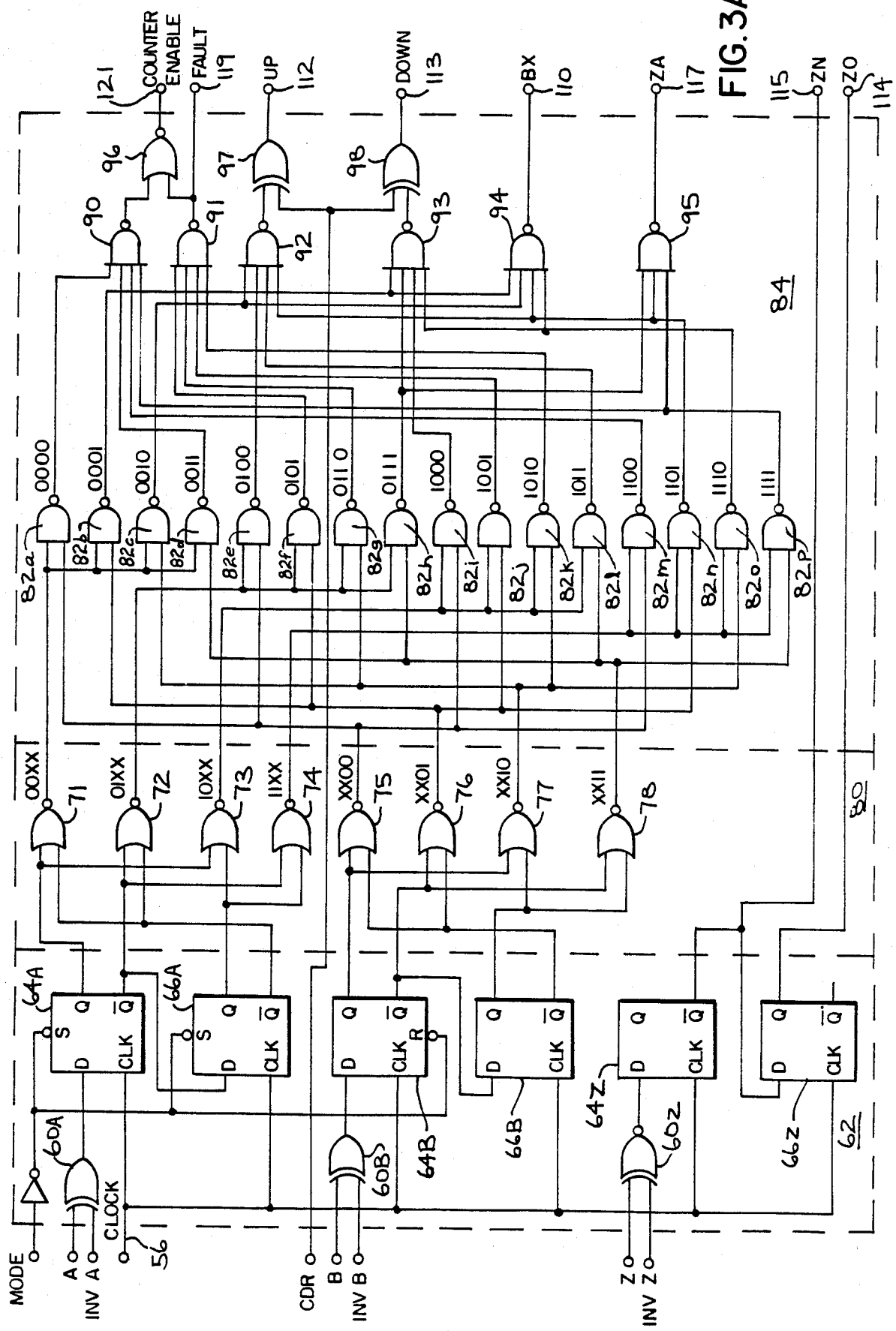
FIGS. 3 A and B are detailed schematic diagrams of the digital circuit for processing the encoder signal in the u FIG. 2 transducer circuit.

In order to fully understand how the transducer circuit in FIG. 2 operates in the encoder mode, the details of the encoder signal processor 30 shown in FIGS. 3A and B must be described. The portion of the circuit in FIG. 3A performs digital quadrature detection of the A and B signals to determine the direction of rotation. With initial reference to FIG. 3A, the circuit is divided into an input section 62, an intermediate section 80 and an output section 84.

The input section 62 consists of three channels, one for each of the input signals A, B, and Z. The A and B signals from the encoder are coupled to one input of separate exclusive OR gates 60 A and B respectively in the input. section 62. The Z input signal is coupled to an input of an exclusive NOR gate 60Z. The other input of each of the input gates 60A, B and Z receives a signal from the encoder configuration register 54 which indicates whether the respective encoder signal should be inverted before further processing by the circuit in FIG. 3A. As noted previously, encoders from different manufacturers have different polarity output signals. The configuration register 54 contains three bits, designated INVA, INVB, and INVZ, which are applied to the other input of the three input gates 60A, B, and Z. The logic level of these three bits determines whether the corresponding encoder input signal is inverted. The input gates 60A, B, and Z enable the processing circuit 10 to accommodate different polarity encoder signals.

The input section 62 of the encoder signal processor 30 further includes six D-type flip flops, 64A, B and Z and 66A, B and Z. The D input terminal of each of the first flip flops 64A, B and Z is connected to the output of the correspondingly lettered input gate 60A, B and Z. The not Q output of each of the first flip flops 64A, B and Z is coupled to the D input of the corresponding one of the second flip flops 66A, B and Z respectively. The clock input terminal of each of the flip flops 64 A, B and Z and 66 A, B and Z is connected to the clock signal line 56 from clock circuit 22. The CLOCK signal causes each of the pair of flip flops 64 and 66 coupled to the corresponding input line A, B or Z to store two consecutive binary samples of the input signal. Actually the second flip flops 66A, B and Z store the inversion of the first samples. With each clock pulse received by the encoder signal processor 30 the sample of the first flip flop 64 for each of the three channels A, B and Z is shifted into the second flip flop 66 for that channel. At this time a new sample of the signal for that channel will be taken and stored temporarily in the first flip flop 64A, B or Z.

The outputs from the two flip flops 64Z and 66Z for the index signal require no further processing by the circuitry of FIG. 3A and are coupled directly to the output terminals as the old Z (ZO) and the new Z (ZN) sample signals. The not Q output from flip flop 64Z is coupled to the new Z (ZN) terminal 115 of the circuit in FIG. 3A and the Q output of flip flop 66Z is connected to the old Z (ZO) terminal 114 of the circuit.

The outputs from the flip flops 64A and B and 66A and B of the input section 62 are connected to various ones of eight NOR gates 71–78 in the intermediate processing section 80, as shown in FIG. 3A. Each of the NOR gates 71–78 compares the two consecutive signal samples from the flip flops 64 and 66 of their respective channel A or B. NOR gates 71–74 process the A signal samples and NOR gates 75–78 process the B signal samples. A high output signal is produced by one of the four NOR gates 71–74 and 75–78 of each channel A or B which indicates the logic levels of the two signal samples for that channel. NOR gate 71 will produce a high output level if both signal samples are low logic levels (zeroes), NOR gate 72 will produce a high output level if the first signal sample is a low logic level and the second signal sample is a high logic level (a one). Similarly, NOR gate 73 will produce a high logic level when the first signal sample is a high logic level and the second signal sample is a low logic level. The fourth NOR gate 74 will produce a high logic level if both signal samples are high. These various sample conditions are represented by the numerical bit pattern above each of the NOR gate output lines in FIG. 3a. In the same regard, the B signal NOR gates 75–78 detect a similar set of bit patterns in the signal samples from that channel.

The outputs from the NOR gates 71–78 in the intermediate section 80 are connected to various ones of sixteen primary NAND gates 82a–p in the output section 84 as shown in FIG. 3a. The primary NAND gates 82a–p detect separate ones of the sixteen possible combinations of the outputs from the eight NOR gates 71–78 of the intermediate section 80 as indicated by the numerical bit patterns at the output lines of the primary NAND gates 82a–p. The first two bits of each pattern represent the A signal samples and the last two bits are the B signal samples. The output of the primary NAND gate 82a–p which corresponds to the bit pattern of two consecutive samples of the A and B signals will be at a low logic level. For example, the output of the topmost primary NAND gate 82a goes low if the two consecutive samples of the A signal are both zero bits and the two consecutive samples of the B signal are also both zero bits. Similarly, the bottommost primary NAND gate 82p output goes low if all four of the A and B signal samples are logic ones. The other fourteen primary NAND gates 82b–o correspond to the remaining combinations of the two signal samples from the A channel and the two signal samples from the B channel.

The outputs from the primary NAND gates 82a–p are connected to the inputs of six secondary NAND gates 90–95. Specifically, the outputs from primary NAND gates 82c, e, l and n indicate signal sample patterns that occur if the encoder shaft is rotating in direction 100 (FIG. 4). Rotation in this direction 100 is arbitrarily defined as producing an incrementation, or up counting, of the position counter 36. These NAND gate outputs are all coupled to the up count secondary NAND gate 92. Similarly primary NAND gates 82b, h, i and o indicate rotation in the opposite direction 101, which is defined as producing a down counting of the position counter 36. These latter four NAND gates have their outputs coupled to the down count secondary NAND gate 93. Each of the outputs from up and down count secondary NAND gates 92 and 93 is coupled to a separate exclusive OR gate 97 and 98 respectively to provide encoder direction indication signals. The output (designated UP) of the exclusive OR gate 97 is coupled to the position counter 36 to determine the direction of its counting. These exclusive OR gates 97 and 98 also receive the change direction (CDR) output bit from the encoder configuration register 54 to invert the counter direction signals if required for certain encoders.

The output from primary NAND gates 82f, g, j and k are coupled to the fault secondary NAND gate 91. A low level output from any of these four primary NAND gates 82f, g, j and k indicates that a transition has occurred simultaneously in the A and the B signals. As the two signals are in quadrature such simultaneous transitions can not legitimately occur. Therefore, such an occurrence generates a fault signal at terminal 119.

The output from the remaining four primary NAND gates 82a, d, m and p are connected to secondary NAND gate 90. A low level at the output of any of these primary NAND gates occurs when the encoder is not moving. The outputs from secondary NAND gates 90 and 91 are coupled to OR gate 96 to produce an active low level counter ENABLE signal at terminal 121.

The outputs from primary NAND gates 82b, c, n and o are also coupled to secondary NAND gate 94 to provide a high output BX signal on terminal 110 whenever a valid transition of the B signal occurs. The primary NAND gates 82h, n and p are also coupled to secondary NAND gate 95 to provide a high level Z active (ZA) signal on terminal 117 indicating a valid state with high levels for both the A and B signals.

The operation of the quadrature detector portion of the encoder processor 30 shown in FIG. 3a is best understood with reference to the encoder waveforms illustrated in FIG. 4. As the A and B output signals are in quadrature, one will lead the other by 90 degrees depending upon the direction 100 or 101 in which the encoder is rotating. If the encoder is rotating in direction 100 the B signal leads the A signal, whereas if the rotor is going in direction 101 the A channel signal leads. Movement in direction 100 has been arbitrarily defined as causing an incrementation of the position counter 36 and movement in the opposite direction 101 decrements the counter. For example, if the encoder is moving in direction 100 at time $T_2$, the two samples of the A channel will both be zero and the B channel signal will have a previous sample of one and a zero for the current sample. This combination of samples is indicated by a high output from NOR gates 71 and 77 and a low output from the other NOR gates. This output produces an active low output from primary NAND gate 82c which is coupled through NAND gate 92 and exclusive OR gate 97 to produce an active high level on the up count terminal 112. This high level is connected to the position counter 36 causing an incrementation of its count at the next clock pulse.

Similar up count indications are produced from NAND gate 82e when the bit pattern is 0100, NAND gate 82l when the bit pattern is 1011, and NAND gate 82n when the bit pattern is 1101. Each of these bit patterns that produces an up indication occurs when the encoder is rotating in the incrementation direction 100. If the resolver is rotating in the decrementation direction 101, NAND gates 82b, h, i and o produce low output signals indicating the rotation in this direction. The output from each of these NAND gates 82b, h, i and o is coupled to the down NAND gate 93 whose output is coupled via exclusive OR gate 98 to the down signal terminal 113 on FIG. 3A.

The output signals from the quadrature portion of the encoder signal processor 30 shown in FIG. 3A are coupled to the index signal processing portion shown in FIG. 3B. The purpose of the index signal processing circuit is to examine the levels of the three input signals (A, B and Z) and provide periodic resetting of the position counter 36 upon the occurrence of the indexing signal pulse. As will be seen below the encoder signal processor 30 may be configured to handle different types of indexing schemes from various encoders.

The UP and DOWN signals from the output section of the circuit in FIG. 3A are coupled via input terminals 112 and 113 respectively to the J and K inputs of a first flip flop 125. The Q output from the first J-K flip flop 125 is coupled to one of three inputs of first NAND gate 126. The Q output is also connected to a counter preset output terminal 124 which is connected to position counter 36. The not Q output from the first flip flop 125 is coupled to one input of a second three-input NAND gate 128. The old index signal sample (ZO) is applied from terminal 114 to another input of second NAND gate 128 and via inverter 132 to another input of first NAND gate 126. The new index signal sample (ZN) is applied from terminal 115 directly to one input of second and third NAND gates 126 and 130, as well as to via inverter 134 to the third input of NAND gate 128. The Z active (ZA) signal from terminal 117 is coupled to another input of third NAND gate 130.

A signal from the encoder configuration register 54 which indicates whether signal level indexing is to be enabled is coupled via terminal 122 to another input of third NAND gate 130. Another signal from the encoder configuration register 54, which indicates in the alternative that pulse edge sensitive indexing is to be enabled, is coupled from terminal 123 to the clear device terminals of first J-K flip flops 125 and of a second J-K flip flop 136. The pulse edge indexing enable signal on terminal 123 is also coupled via an inverter 138 to the fourth input of third NAND gate 130.

The outputs of first and second NAND gates 126 and 128 are coupled to the inputs of a fourth NAND gate 140 whose output is coupled to the J input terminal of second J-K flip flop 136. The Q output of the second J-K flip flop 136 is coupled to one input of fifth NAND gate 142 whose other input is connected to the B transition signal (BX) terminal 110. The output of the fifth NAND gate 142 is coupled by inverter 144 to the K terminal of second J-K flip flop 136. The output of the fifth NAND gate 142 is also coupled to a sixth NAND gate 146 which also receives the output from the third NAND gate 130. The output from the sixth NAND gate 146 is inverted by inverter 148 to produce the active low position counter RESET signal at terminal 150. Terminal 150 is connected to the reset terminal 37 of position counter 36 via the reset multiplexer 34 (FIG. 2).

The reset terminal 150 is also coupled to an input of seventh NAND gate 152 whose output is connected to the D terminal of D-type flip flop 154. The index flag enable bit from the encoder configuration register 54 is coupled via terminal 118 to the clear device terminal of flip flop 154. The not Q output of flip flop 154 produces the INDEX FOUND FLAG signal on terminal 156 which is also coupled to the other input of the seventh NAND gate 152. Flip flop 154 serves as a data latch for a flag that indicates that the indexing has occurred. Terminal 156 is coupled to a bit storage location in the status register 52 (FIG. 2). Flip flop 154 is cleared by resetting the index flag enable bit in the encoder configuration register 54.

A similar flip flop latch 158 holds a quadrature fault indication. The quadrature fault signal (FAULT) is applied from the terminal 119 of FIG. 3A to an input of NOR gate 160. A high active fault flag enable bit from the encoder configuration register 54 is coupled via terminal 120 to the active low set terminal on D-type flip flop 158. The Q output of flip flop 158 provides a QUADRATURE FAULT FLAG signal on terminal 162 which is coupled to the status register 52. The not Q output is fed back to the other input of NOR gate 160. The CLOCK signal from circuit 22 is fed to the clock terminal on flip flops 125, 136, 154 and 158.

As noted previously, various manufacturers of encoders have implemented different mechanisms for producing the indexing indication. With reference to the waveforms shown in FIG. 4, the index, or Z, signal is defined as having a high level pulse that is less than one cycle of the A and B signals. With this type of signal from the encoder, indexing occurs when all three encoder signals are at a high level as shown by the zero count interval. This form of indexing is referred to herein as signal level indexing. Therefore, with this type of encoder, the indexing circuit simply detects the level of each of the three encoder signals and resets position counter 36 to zero when all three are at a high level.

In this mode of operation, the operator has set the level indexing enable bit in the encoder configuration register 54 and has reset the edge indexing enable bit. The low edge indexing enable bit, applied to terminal 123 of FIG. 3B, disables flip flops 125 and 136 which produces a continuous low level PRESET signal at terminal 124. With a low edge indexing enable bit applied to terminal 123 and a high level bit applied to the level indexing enable terminal 122, two of the four inputs to NAND gate 130 will be high. Therefore, in this state when the Z active (ZA) and the Z new (ZN) signals are both high indicating a coincidence of a high level on each of the three encoder signals A, B and Z, NAND gate 130 will produce a low logic level. In response to the low output from NAND gate 130, NAND gate 146 and inverter 148 will provide a low level position counter RESET signal at terminal 150. The low RESET signal causes the position counter 36 to initialize its count and the low PRESET level determines that the counter resets to zero upon initialization, as is indicated by the count line of FIG. 4. The signal level indexing always initializes the position counter 36 to zero regardless of the direction that the encoder is rotating.

From this point in time each subsequent clock pulse, applied to the position counter 36, will cause the counter to increment if a high level is present on the UP line from the encoder signal processor 30, or to decrement if the UP line is at a low level. If an encoder signal transition has not occurred for a given clock pulse, the ENABLE line will be at a high logic level which disables the counter 36 from counting clock pulses.

FIG. 5 shows the output signal waveforms from a different type of encoder in which length of the index pulse Z is one and a half cycles of the A or B signal. As is apparent from the waveform diagram, the three input signals are all at a high level during intervals T3 and T7. Thus level indexing would occur at different points depending upon the direction of rotation. Therefore, when this type of encoder is used with the present signal processing circuit, the circuit uses pulse edges to produce indexing rather than the level of the three signals from the transducer. Furthermore, the position counter 36 will be loaded with a different initialization count depending upon the direction of rotation when indexing occurs If an encoder that produces a waveform as shown in FIG. 5 is connected to the present signal processing circuitry, the encoder configuration register 54 will contain a high edge indexing enable bit, which is applied to terminal 123, and a low level indexing enable bit, applied to terminal 122 of FIG. 3B. In this mode of operation, each pulse of the CLOCK signal will produce a high Q output from the first J-K flip flop 125 if the encoder is traveling in direction 100 so that a high level up signal is present at terminal 112. Similarly, if the encoder is traveling in the opposite direction 101, the clock pulse will produce a low level Q signal when a high down level is present at terminal 113.

Assuming for the moment that the encoder is traveling in direction 100 the first flip flop 125 will have a high Q level producing a high PRESET signal on terminal 124. The circuitry in the upper portion of FIG. 3B produces a low level RESET signal on terminal 150 upon the occurrence of the first transition of the B channel signal, as indicated by the B transition signal BX, after the index signal Z makes a low to high transition. This will occur at time interval T3 on the waveform diagram of FIG. 5. The position counter 36 upon receiving an active low RESET signal from terminal 150 will respond by initializing its count. Because the PRESET signal on line 124 is high the position counter 36 will be loaded with the number three indicating that the encoder is now in position three.

In the pulse edge indexing mode the circuit of FIG. 3B will respond to the indexing signal differently if the encoder is moving in the opposite direction 101. In this situation, the DOWN signal on line 113 is high producing a low level Q output signal from the first J-K flip flop 125. This low level Q signal produces a low level PRESET signal on line 124. The Q and NOT Q signals from flip flop 125 also configure the edge processing circuitry in FIG. 3B differently than when the encoder is rotating in direction 100. In this instance, a low level RESET signal on terminal 150 will be produced on the first transition of the B signal after the index signal makes a high to low transition. This occurs at interval T0. In this instance because the PRESET signal sent to the position counter 36 is low, the RESET signal will cause the position counter to initialize its count to zero. Therefore, the index processing circuitry in FIG. 3B provides a mechanism for initializing the position counter 36 to the proper value in response to the index pulse regardless of the direction of rotation of the encoder.

The index processing circuit in 3B also provides an index found latch 154 which produces an output signal on terminal 156 when the indexing has occurred. This signal is stored in the status register 52 to provide an indication to the microprocessor 30 that the encoder signal processor has detecting an index event. Similarly, another latch 158 provides an indication when a quadrature fault has occurred. This event is also stored in the status register 52 for sensing by the microprocessor 12 so that a proper response may be taken.

With reference to FIG. 2, in the encoder mode the SAMPLE signal from clock 22 is coupled through multiplexer 44 to the enable input of the position register 40. Upon the rising edge of the SAMPLE signal the position register 40 will store the contents of the position counter 36 which represents the encoder's position at that time. After the SAMPLE signal goes inactive the microprocessor 12 in FIG. 1 reads the contents of the position register 40 and convert it to the properly formated data for output latch 28. The position count may be used directly as an indication of the encoder's position or multiplied by 0.9 degrees (the number of degrees between encoder signal states).

Touch Probe Operation

In addition to receiving sensory signals from the transducer 8, the transducer circuit 18 in FIG. 2 also has a touch probe 6 connected to it. Various types of touch probes (also referred to as digital gauging probes) have been conventionally used with numerical controlled machine tools to determine the actual position of a datum point on the work piece or to measure various dimensions of the workpiece. Typically, such probes are precision limit switches mounted on the head of the machine tool which switches open upon contact with the workpiece. The numerical controlled machine tool responds to the opening of the touch probe switch by storing the position of the head at the time that the probe was activated.

The present transducer circuit 18 provides an apparatus for processing signals from such touch probes. The touch probe portion of the transducer circuit 18 operates in the same manner regardless of whether the transducer circuit 18 is configured for operation with a resolver or an encoder. The output from the touch probe 6 is coupled to the input of a touch probe signal detector 50 which produces a signal pulse upon the opening of the touch probe switch. This signal pulse from the touch probe signal detector 50 is one clock pulse wide. The output of the touch probe signal detector is coupled to the strobe input of the touch probe register 42 so than the output pulse causes the register to store the count from the position counter 36. This stored count represents the position of the transducer 8 at the point in time when the touch probe was activated.

The pulse signal output from the touch probe detector 50 is also connected to one input of the status register 52 so that a bit within the register is set upon the touch probe detector going active. Periodically, for example, once during each period of the SAMPLE signal, the contents of the status register are read by the microprocessor 12. With respect to the touch probe operation, the microprocessor 12 then examines the status register bit corresponding to the touch probe circuit. If that bit is set, the microprocessor 12 addresses the touch probe register 42 and reads the position count that was taken at the point in time when the touch probe 6 was activated. The microprocessor 12 then processes this position information according to the mode of operation, resolver or encoder, in which the position sensing system is configured. This processing determines the actual position of the transducer and thereby the touch probe 6 at the time contact was made with the workpiece.

We claim:

1. A system for processing signals from a transducer for monitoring the angular position of an object rotatable in either of two directions, which transducer may be either a first type providing first and second signals whose phase relationship indicates the direction of the object's rotation and whose number of amplitude transitions relative to an index pulse from the transducer indicates the angular position or a second type of transducer providing an output signal whose phase varies with changes in the angular position, said system comprising:
   first, second and third input terminals for coupling the transducer to said system said first terminal for receiving the first signal from the first type of transducer, said second terminal for receiving the second signal from the first type of transducer and the output signal from the second type of transducer, and said third terminal for receiving the index pulse from said first type of transducer;
   a source of a pulsed clock signal and a sampling signal;
   means coupled to said second input terminal for detecting zero crossings of the signal applied to that terminal;
   a signal processor coupled to said input terminals for detecting the phase relationship between the signals applied to the first and second input terminals to produce a signal indicating the direction of the object's rotation and to produce a counter enable signal, and for producing a counter reset signal in response to the signals applied to the three input terminals;
   means for counting the pulses of the clock signal in response to a signal applied to an enable terminal, the direction of the counting being in response to a signal at a direction input terminal, said counting means having means for initializing its count to a given value in response to a signal applied to a reset terminal;
   a first position register for storing a count from said counting means in response to a signal applied to an enable terminal of said first position register; and
   mode selection means which in a first state for the first type of transducer couples the counter reset signal from said signal processor to the reset terminal of said means for counting, couples the sampling signal to the enable terminal of said first position register, couples the direction indicating signal of said signal processor to the direction input terminal of said means for counting, and couples the counter enable signal from said signal processor to the enable terminal of said means for counting; and in a second state for the second type of transducer couples an output of the means for detecting zero crossings to the enable terminal of said first position register, couples the sampling signal to the reset terminal of said means for counting, and applies signals to enable the means for counting to count in one direction.

2. The system as recited in claim 1 wherein said signal processor includes:
   first and second sampling means each coupled to one of the first and second input terminals for sampling the signals present at the input terminals; and
   means for comparing two consecutive signal samples taken by the first sampling means with two consecutive samples taken by the second sampling means to produce a signal indicating the direction of transducer rotation and the counter enable signal.

3. The system as recited in claim 2 wherein said signal processor further includes:

a third sampling means for sampling the signal applied to the third terminal in response to the clock signal;

said means for comparing also produces a signal indicating when the signals applied to the first and second input terminals are both at a first signal level; and means coupled to the comparing means and the third sampling means for producing the counter reset signal when the signals at all three input terminals are at the first signal level.

4. The system as recited in claim 2 wherein said signal processor further includes:

a third sampling means for sampling the signal applied to the third input terminal in response to the clock signal to detect the transducer index pulse;

said means for comparing also produces a signal indicating when the signal applied to one of the first and second input terminals makes a transition between a first and a second signal levels;

means for generating a counter reset signal when the object is rotating in one direction upon the occurrence of the first transition of the signal at the one terminal during the index pulse, or when the object is rotating in the other direction upon the occurrence of the first transition of the signal at the one terminal after the index pulse ends.

5. The system as recited in claim 4 wherein said means for generating a counter reset signal includes:

means for setting the count of said means for counting to a first value upon the occurrence of the reset signal when the object is rotating in a first direction, and for setting the count to a second value upon the occurrence of the reset signal when the object is rotating in the second direction.

6. The system as recited in claim 1 wherein said signal processor includes a fault detection circuit for detecting invalid states of the signals at the first and second input terminals.

7. The system as recited in claim 1 wherein said mode selection means further includes means coupled to the signal processor for forcing the transducer rotation direction signal to indicate one direction when said mode selection means is in the second state.

8. The system as recited in claim 1 further comprising a second position register for storing the count from said means for counting in response to an enable signal applied to a fourth input terminal of the system.

9. A system for determining the position of an object from an output signal of a transducer in which the phase of the output signal varies with the position, said system comprising:

a signal generator which produces an alternating clock signal and a sampling signal having a period substantially equal to a plurality of periods of the transducer output signal;

means for counting cycles of said clock signal to produce a count indicative of the position of the object and having a count reset terminal;

means for coupling the sampling signal to the count reset terminal of said means for counting;

a register for storing the count from said counting means in response to a signal applied to an enable terminal;

means for generating a signal indicative of zero crossings in the transducer output signal; and means responsive to the signal indicative of zero crossings and to said sampling signal for producing a signal at the enable terminal of said register.

10. The system as recited in claim 9 further comprising means for computing the position of the object from the count stored in the register.

11. The system as recited in claim 10 further comprising means for extrapolating a position from the count stored in said register to determine the position of the object at a later point in time than when the count was stored.

12. A system for determining the position of an object from two quadrature output signals from a transducer coupled to the object, the transducer also producing a periodic index signal, said system comprising:

a signal processor for detecting the phase relationship of the transducer output signals to produce a direction signal, and producing a reset signal in response to the two output signals and the index signal;

a source of an alternating clock signal;

a bidirectional counter for counting the cycles of said clock signal in response to the direction signal of said processor to produce a count indicative of the position; and means for resetting the count of said counter having a first mode in which upon the occurrence of the reset signal the count is always reset to the same value, and having a second mode in which upon the occurrence of the reset signal the counter is reset to either a first or a second value in response to the direction signal.

13. The system as recited in claim 12 further comprising a register for storing the count from said counter in response to a sampling signal from said signal generator.

14. A system for processing signals from either a resolver which produces and output signal having a phase which varies with an object's angular position sensed by the resolver, or an encoder which produces first and second output signals and an index signal, said system comprising;

a first input terminal for receiving the first output signal from an encoder;

a second input terminal for receiving the second output signal from an encoder and the output signal from a resolver;

a third input terminal for receiving the index signal from an encoder;

a signal generator for producing an alternating clock signal and a sampling signal;

a bidirectional counting means for counting the cycles of the clock signal to produce a count, and having a count enable terminal, a count direction terminal and a count reset terminal;

a signal processing means coupled to said three input terminals, for detecting the phase relationship between the signals applied to said first and second input terminals to produce a count direction signal and count enable signal, and for producing a count reset signal in response to the signals applied to the three input terminals;

means for detecting zero crossings of the signal applied to said second input terminal;

a register for storing the count from said counting means in response to a signal at an enable terminal of said register; and a control means having a first mode wherein the count enable signal, the count direction signal and the count reset signal from said signal processing means are coupled to the corresponding terminals of said counting means and in which the sampling signal is coupled to the enable terminal of said register; and having a second mode in which the counting means is continuously enabled to count in one direction with the sampling signal applied to the reset terminal of the counting means and in which an output of said means for detecting zero crossings is coupled to the enable terminal of the register.

15. The system as recited in claim 14 wherein said control means includes means for coupling the output of said means for detecting zero crossings to the enable terminal of said register in response to the sampling signal when said control means is in the second mode.

* * * * *

UNITED STATES PATENT AND TRADEMARK OFFICE
CERTIFICATE OF CORRECTION

PATENT NO. : 4,831,510

DATED : May 16, 1989

INVENTOR(S) : Ernst H. Dummermuth, et al.

It is certified that error appears in the above-identified patent and that said Letters Patent is hereby corrected as shown below:

Abstract, Line 9, change "rest" to --reset--.

Column 6, Line 65, change "NP=PC MOD 4000" to --NP=$|PC|$ MOD 4000--

Signed and Sealed this

Twenty-eighth Day of November 1989

Attest:

JEFFREY M. SAMUELS

*Attesting Officer*    *Acting Commissioner of Patents and Trademarks*